(12) United States Patent
Ueyanagi et al.

(10) Patent No.: US 6,346,735 B1
(45) Date of Patent: Feb. 12, 2002

(54) SEMICONDUCTOR SENSOR STRUCTURE AND METHOD OF MANUFACTURING THE SAME

(75) Inventors: Katsumichi Ueyanagi; Mitsuo Sasaki, both of Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 09/649,055

(22) Filed: Aug. 29, 2000

(30) Foreign Application Priority Data

Sep. 30, 1999 (JP) .......................................... 11-280783

(51) Int. Cl.$^7$ .......................... H01L 29/82; H01L 21/00
(52) U.S. Cl. .......................................... 257/415; 438/52
(58) Field of Search .................................. 257/415, 417, 257/418; 73/514.21, 514.23, 514.32, 514.36, 514.37, 514.38; 438/50, 52; 216/2, 58, 72, 83, 95, 99; 428/131, 141, 156, 901

(56) References Cited

U.S. PATENT DOCUMENTS

| | | |
|---|---|---|
| 4,979,149 A | 12/1990 | Popovic et al. |
| 5,885,468 A * | 3/1999 | Kozlowski ............... 216/2 |
| 5,939,171 A * | 8/1999 | Biebl ..................... 428/141 |

FOREIGN PATENT DOCUMENTS

| | | |
|---|---|---|
| EP | 0 606 767 | 7/1994 |
| GB | 2 118 724 | 11/1983 |
| JP | 7-209105 | 8/1995 |
| JP | 7-245414 | 9/1995 |
| WO | 93/21536 | 10/1993 |

OTHER PUBLICATIONS

JP 2000022171 A Nippondenso Abstract.

* cited by examiner

Primary Examiner—Keith Christianson
(74) Attorney, Agent, or Firm—Kanesaka & Takeuchi

(57) ABSTRACT

A semiconductor device includes a deformable sensor structure spaced apart from a substrate, and convexities are formed on the lower surface of the sensor structure with tips of the convexities pointing to the substrate. The convexities of the deformable sensor structure facilitate reducing the contact area between the sensor structure and the substrate and attractive force caused by surface tension of an etchant or washing liquid. Thus, the structure prevents the sticking phenomena, improves the throughput and reduces the manufacturing costs.

10 Claims, 9 Drawing Sheets

SEMICONDUCTOR SENSOR STRUCTURE AND METHOD OF MANUFACTURING THE SAME

BACKGROUND OF THE INVENTION AND RELATED ART STATEMENT

The present invention relates to a semiconductor structure used in sensors for sensing dynamic quantities. The present invention relates also to a method of manufacturing the semiconductor structure.

At first, conventional methods of manufacturing a semiconductor structure are explained with reference to FIGS. 6(a) through 8(f).

FIGS. 6(a)–6(e) describe a first conventional method of manufacturing a semiconductor structure.

Referring now to FIGS. 6(a)–6(e), an insulation layer 11 of boro-phospho silicate glass (BPSG) or phospho silicate glass (PSG) is formed on an Si substrate 10 in the step shown in FIG. 6(a). A polysilicon layer 12, that will be a movable electrode and a stationary electrode later, is formed on the insulation layer 11. Alternatively, silicon on an insulator (hereinafter referred to as "SOI") wafer, including an oxide insulation layer 11 bonded onto the Si substrate 10 and the Si active layer 12 on the oxide insulation layer 11, is used.

In the step of FIG. 6(b), a resist film is formed on the polysilicon layer (or the Si active layer) 12, and the resist film is patterned. Then, the polysilicon layer (or Si active layer) 12 with the patterned resist film thereon is etched, resulting in a sensor structure 13.

In the step of FIG. 6(c), the oxide insulation layer 11 or sacrificed layer, such as the BPSG insulation layer, PSG insulation layer, or Si oxide layer, is etched with buffered hydrofluoric acid (BHF) or such an etchant 20.

Thus, a polysilicon structure 30 including the deformable sensor structure 13 formed of Si beams is formed above the central part of the substrate 10. The polysilicon structure 30 is spaced apart from the Si substrate 10 in the central part of the Si substrate 10. The polysilicon structure 30 is sustained by the beams on the Si substrate 10 in the peripheral part of the Si substrate 10.

In the step of FIG. 6(d), the etchant 20 is replaced by a cleaning liquid, such as pure water and isopropyl alcohol (IPA), and the region including the polysilicon sensor structure 13 is washed with the cleaning liquid.

In the drying step of FIG. 6(e), surface tension 21 of the cleaning liquid occurs in the gap between the sensor structure 13 and the Si substrate 10. The sensor structure 13 with low rigidity is attracted to the Si substrate 10 by the surface tension 21.

FIGS. 7(a)–7(h) describe a second conventional method of manufacturing a semiconductor structure.

Referring now to FIG. 7(a), an insulation layer 11 of BPSG or PSG is formed on a Si substrate 10. A polysilicon layer 12, that will be a movable electrode and a stationary electrode later, is formed on the insulation layer 11. Alternatively, an SOI wafer, including an oxide insulation layer 11 bonded onto an Si substrate 10 and an Si active layer 12 on the oxide insulation layer 11, is used.

In the step of FIG. 7(b), a resist film is formed on the polysilicon layer (or Si active layer) 12, and the resist film is patterned. Then, the polysilicon layer (or Si active layer) 12 with the patterned resist film thereon is etched, resulting in a sensor structure 13.

In the step of FIG. 7(c), a sacrificed layer (BPSG insulation layer, PSG insulation layer, or Si active layer) is etched with an etchant 20 to an extent that the sensor structure 13 does not become completely free.

In the step of FIG. 7(d), the sensor structure 13 and the sacrificed layer remaining under the sensor structure are covered with a photosensitive polymer film 40, and the photosensitive polymer film 40 is patterned so that the sensor structure 13 is sustained by the patterned photosensitive polymer film.

In the step of FIG. 7(e), the remaining sacrificed layer is etched and the resulting sensor structure 13 is dried. Since the sensor structure 13 is sustained by the rigidity of the photosensitive polymer 40, any sticking phenomenon does not occur between the sensor structure 13 and the substrate 10.

In the step of FIG. 7(f), the photosensitive polymer 40 is removed by ashing or such a dry process.

The sensor structure 13 is made free and deformable through the steps of FIGS. 7(g) and 7(h).

FIGS. 8(a)–8(f) describe a third conventional method of manufacturing a semiconductor structure disclosed in Japanese Unexamined Laid Open Patent Publications No. H07-209105 and No. H07-245414.

Referring now to FIG. 8(a), an insulation layer 11 of BPSG or PSG is formed on an Si substrate 10. A polysilicon layer 12, that will be a movable electrode and a stationary electrode later, is formed on the insulation layer 11. Alternatively, an SOI wafer, including an oxide insulation layer 11 bonded onto the Si substrate 10 and the Si active layer 12 on the oxide insulation layer 11, is used.

In the step of FIG. 8(b), a resist film is formed on the polysilicon layer (or Si active layer) 12, and the resist film is patterned. Then, the polysilicon layer (or Si active layer) 12 with the patterned resist film thereon is etched, resulting in a sensor structure 13.

In the step of FIG. 8(c), the insulation layer 11 or sacrificed layer (BPSG insulation layer, PSG insulation layer, or Si active layer) is etched with BHF or such an etchant 20.

In the step of FIG. 8(d), the etchant is replaced by a sublimable material 50, such as paradichlorobenzene and naphthalene, in the liquid state thereof. The sublimable material 50 is solidified in the gap between the sensor structure 13 and the Si substrate 10.

The sensor structure 13 is formed finally through the steps of FIGS. 8(e) and 8(f) by sublimating the sublimable material 50.

The conventional semiconductor structures or the conventional methods of manufacturing the semiconductor structures have the problems described below.

As described in connection with the steps of FIGS. 6(d) and 6(e) in the first conventional manufacturing method, the surface tension 21 of the cleaning liquid occurs in the gap between the polysilicon structure 30 and the Si substrate 10. The sensor structure 13 with low rigidity is attracted to the Si substrate 10 by the surface tension 21, to cause the sticking phenomenon.

In the second conventional manufacturing method described with reference to FIGS. 7(a)–7(h), it is difficult to precisely pattern the photosensitive polymer film 40 on the condition that unevenness of several $\mu$m is caused by the etching of the first sacrificed layer. It is also difficult to inject equally the photosensitive polymer down to the bottom surfaces of the trenches etched through the sacrificed layer.

Furthermore, it is difficult to completely remove the photosensitive polymer film 40 by ashing or such a dry process, causing low throughput for the manufacture. The incomplete removal of the photosensitive polymer film 40 is hazardous for securing the deformable range of the sensor structure 13, causing a sensor with low reliability.

The second conventional manufacturing method increases the manufacturing costs, since the sacrificed layer is etched through two isolated steps and the step of burning (ashing) the photosensitive polymer film 40 is added.

According to the third conventional manufacturing method, the sublimable material 50 is not removed completely, remaining as foreign substances on the clean sensor surface. The remaining foreign substances impair the reliability of the sensor.

In view of the foregoing, it is an object of the invention to provide a highly reliable semiconductor structure.

It is another object of the invention to provide a method of manufacturing a reliable semiconductor structure, that facilitates, without employing any special step, preventing sticking phenomena, improving the throughput and reducing the manufacturing costs.

SUMMARY OF THE INVENTION

According to an aspect of the invention, there is provided a semiconductor structure including: a substrate; a deformable beam structure above the substrate; and convexities on the lower surface of the deformable beam structure, the convexities with the tips extending to point to the substrate. The tips of the convexities and the substrate are spaced apart widely enough to provide the deformable beam structure with a predetermined deformable range.

Advantageously, the convexities are formed beneath a portion of the deformable beam structure where the largest deformation is formed, or beneath portions of the deformable beam structure where the deformations thereof are relatively large.

According to another aspect of the invention, there is provided a semiconductor structure including: a tertiary laminate including a first layer formed of a silicon substrate, a second layer on the first layer formed of an insulation layer, and a third layer on the second layer formed of a silicon layer; and a deformable beam structure in the third layer including device elements wired on the third layer, weight sections having a plurality of through holes bored through the third layer, beam sections sustaining the weight sections and having sensor elements wired on the third layer for detecting displacements, and convexities remaining on the lower surfaces of the weight sections with the tips thereof pointing to the first layer after etching off the second layer through the through holes of the third layer.

According to a further aspect of the invention, there is provided a method of manufacturing a semiconductor structure including a substrate and a deformable beam structure above the substrate. The method includes the steps of: preparing a laminate formed of the substrate, an insulation layer on the substrate, and an active layer on the insulation layer; wiring functional devices on the active layer; forming etching trenches in the active layer down to the insulation layer; etching off the insulation layer with an etchant injected into the etching trenches to form the deformable beam structure; and adjusting the period of time for the etching off to form convexities extending from the deformable beam structure with the tips thereof pointing to the substrate and to space apart the tips of the convexities and the substrate from each other widely enough to provide the deformable beam structure with a predetermined deformable range.

Advantageously, the convexities are formed beneath the portion of the deformable beam structure where the largest deformation is caused, or beneath the portions of the deformable beam structure where the deformations are relatively large.

According to a still further aspect of the invention, there is provided a method of manufacturing a semiconductor structure. The method includes the steps of: preparing a laminate including a first layer formed of a silicon substrate, a second layer formed of an insulation layer, and a third layer formed of a silicon active layer; wiring functional devices on the third layer; forming etching trenches in the third layer down to the second layer; etching off the second layer through the etching trenches to form a deformable beam structure, the deformable beam structure including weight sections and beam sections sustaining the weight sections, the beam sections including sensor elements for detecting displacements; and adjusting the period of time for the etching off to form convexities extending from the weight sections with the tips thereof pointing to the first layer.

DETAILED DESCRIPTION OF PREFERRED EMBODIMENTS

Now the invention will be explained hereinafter with reference to the accompanied drawings which illustrate the preferred embodiments of the invention.

At first, the invention will be outlined.

The invention will be described in connection with a semiconductor structure and a method of manufacturing the semiconductor structure, which use a ternary layered SOI (silicon on insulator) wafer including a first layer formed of an Si substrate and a binary layered wafer bonded onto the first layer, the binary layered wafer including an Si third layer and an insulator second layer formed by thermally oxidizing the Si third layer.

In forming the Si third layer of the SOI wafer to form a semiconductor sensor structure for measuring dynamic quantities, such as pressure, acceleration and angular velocity, the etching space between the trenches for defining the shape of the sensor and the through holes etched for removing the insulator second layer under the sensor structure, and the space between the trenches and the through holes, are not fixed at respective certain values. The time for etching the trenches and the through holes is controlled so that the spacing values are longer in a specific area than those in the other area.

By the etching time control, some portions of the insulator second layer are left under the sensor structure as convexities in the specific area, where the spacing values are longer. The convexities extend downward from the lower face of the Si third layer toward the first layer. The tips of the convexities and the upper surface of the first layer are spaced apart widely enough to provide the sensor structure with a certain deformable range. Although the invention is described in connection with a ternary layered SOI wafer, the invention is applicable to other layer structures.

Now the preferred embodiments of the invention will be described below.

First embodiment

Now the first embodiment of the invention will be described with reference to FIGS. 1(a) through 4.

At first, the structure for sensing acceleration will be described with reference to FIGS. 2 through 4.

Figure 2:
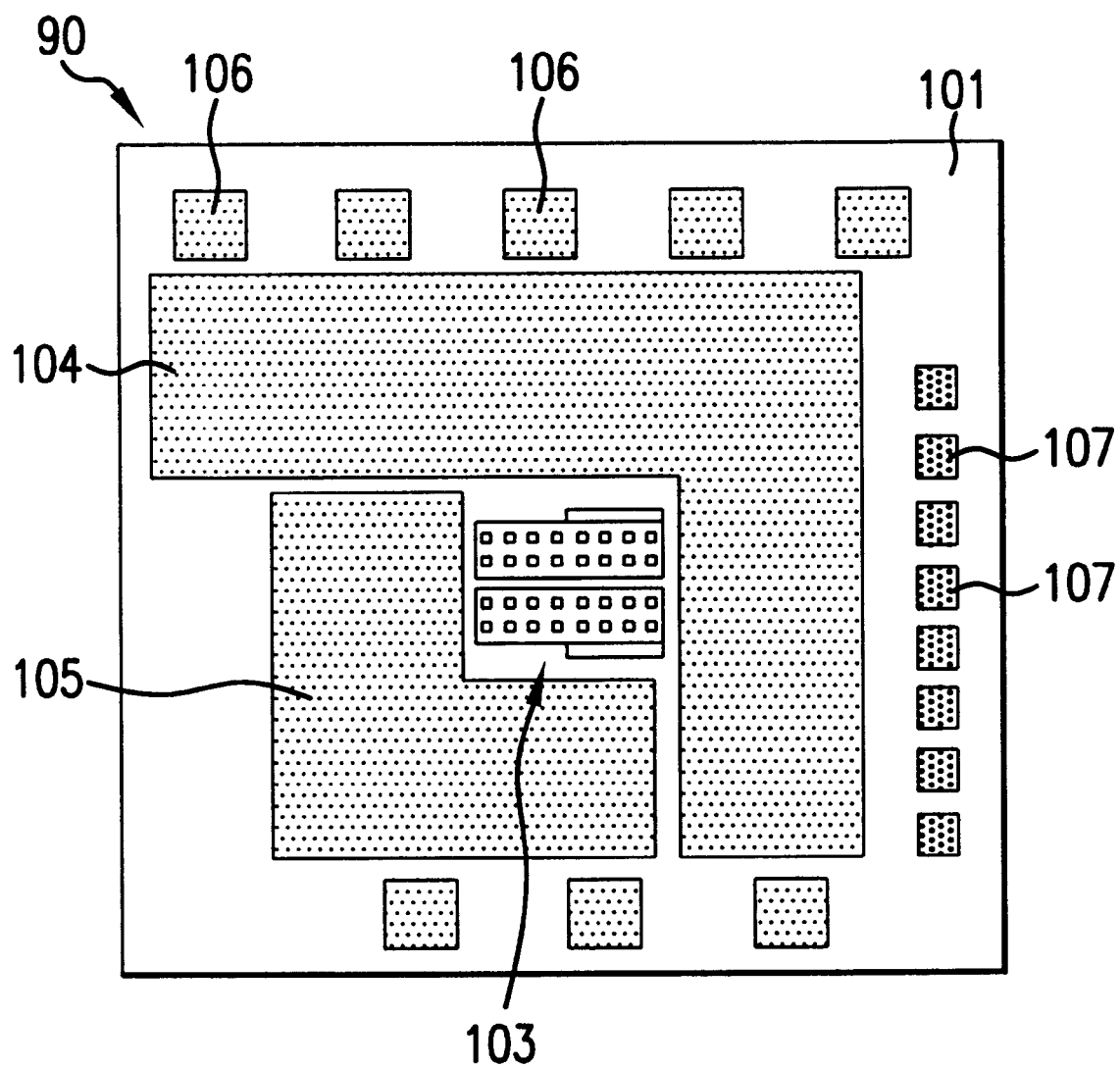
FIG. 2 is a top plan view of an acceleration sensor according to the first embodiment of the invention.
Figures 3A, 3B:
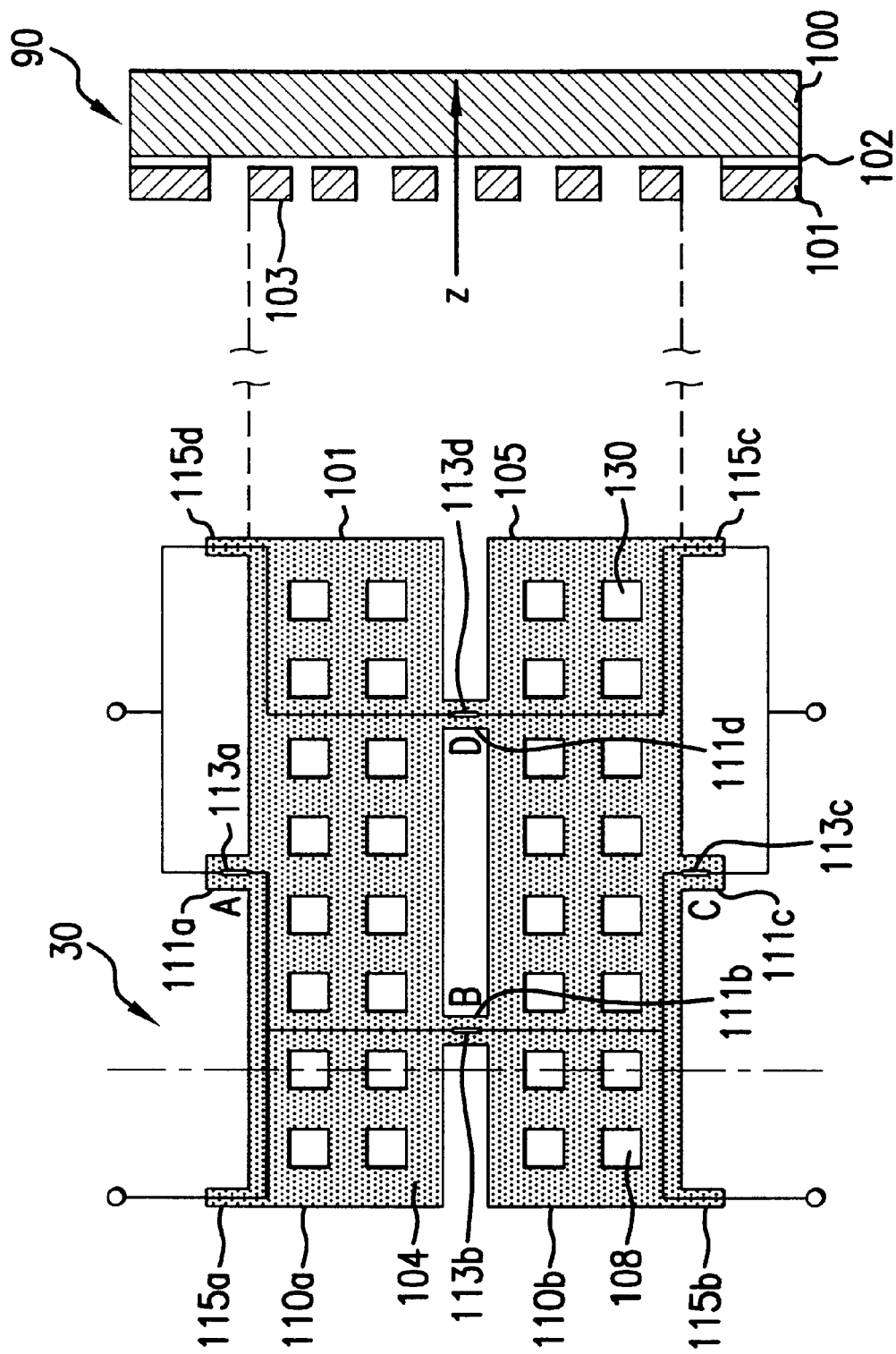
FIG. 3(a) shows an enlarged front view of a sensor portion of the acceleration sensor of FIG. 2.
FIG. 3(b) is an enlarged cross sectional view thereof.

FIG. 2 is a top plan view of an acceleration sensor according to a first embodiment of the invention. FIG. 3(a) shows an enlarged top plan view of the sensor portion of the acceleration sensor of FIG. 2, and FIG. 3(b) shows an enlarged cross sectional view thereof.

A chip 90, on which an acceleration sensor is formed, includes an Si substrate 100, an SiO2 layer 102 on the Si substrate 100, and an Si layer 101 on the SiO2 layer 102 as its fundamental constituent elements. The SiO2 layer 102 is disposed for electrically isolating the Si layer 101 from the Si substrate 100 and for providing a sacrificed layer.

A sensor structure 103, a digital regulator circuit 104, an analog amplifier 105, terminals 106 for input and output, and terminals 107 for digital regulation, are formed on the Si layer 101.

The portion of the SiO2 layer 102 under the sensor structure 103 in the central portion of the chip 90 is removed to form a beam structure that provides the sensor structure 103 with free movement.

As shown in the plan view of FIG. 3(a), the sensor structure 103 includes four beam sections 111a, 111b, 111c and 111d, and weight sections 110a and 110b. The beam section 111a includes a semiconductor strain gauge 113a formed thereon. The beam section 111b includes a semiconductor strain gauge 113b formed thereon. The beam section 111c includes a semiconductor strain gauge 113c formed thereon, and, the beam section 111d includes a semiconductor strain gauge 113d formed thereon. Through holes 108 for etching the sacrificed layer are formed in the weight sections 110a and 110b. The weight sections 110a and 110b are connected with each other by the beam sections 111b and 111d. The sensor structure 103 is sustained by the beam sections 115a, 115b, 115c and 115d at the corners thereof from the portion of the chip 90 surrounding the sensor structure 103.

Figure 4:
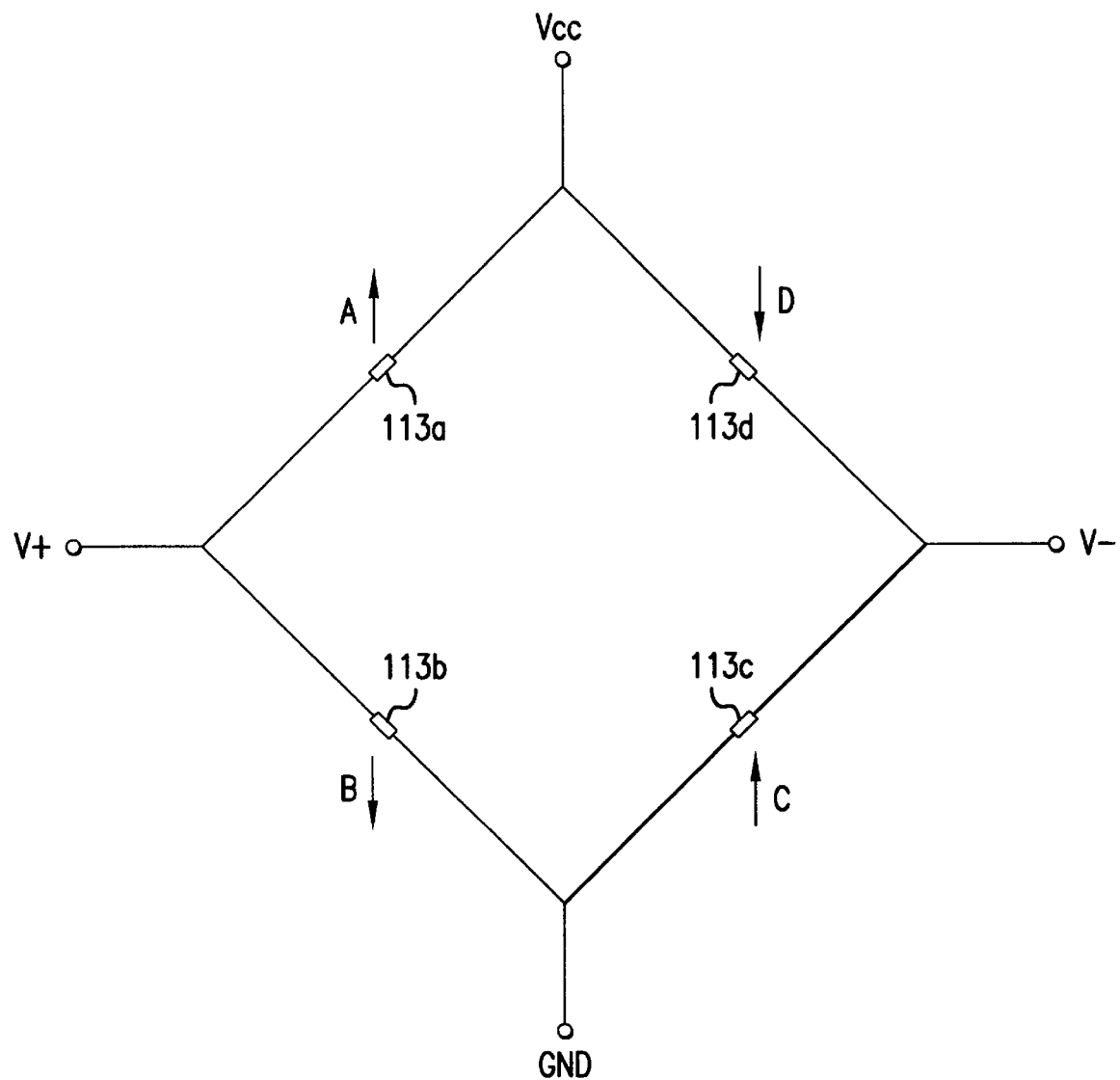
FIG. 4 is a circuit configuration forming a semiconductor strain gauge shown in FIG. 3.
Figure 5A:
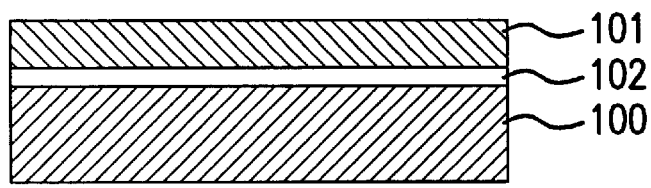
FIGS. 5(a)–5(e) describe a method of manufacturing a semiconductor structure according to a second embodiment of the invention.
Figure 5B:
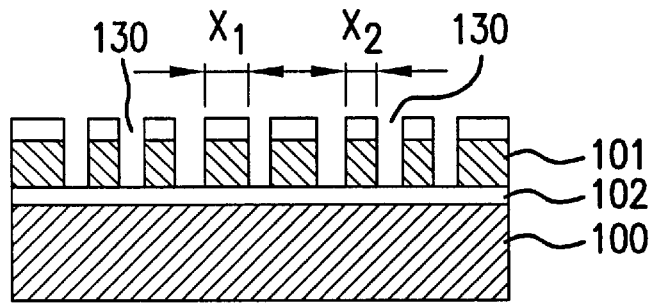
Figure 5C:
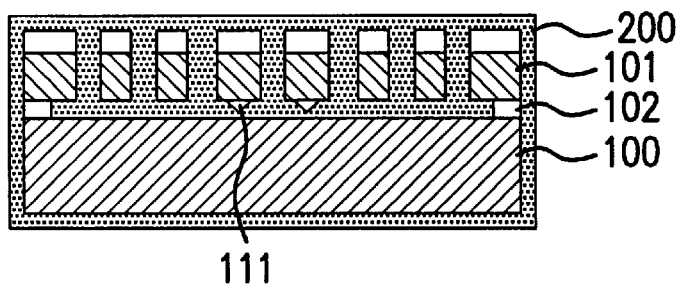
Figure 5D:
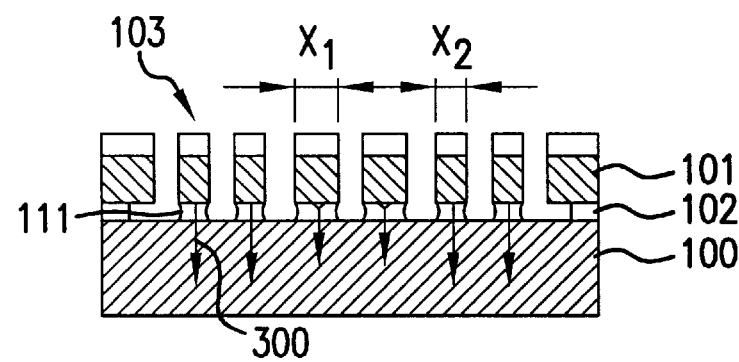
Figure 5E:
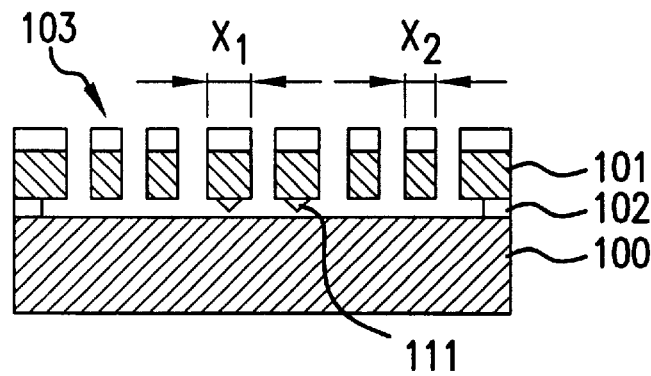
Figure 6A:
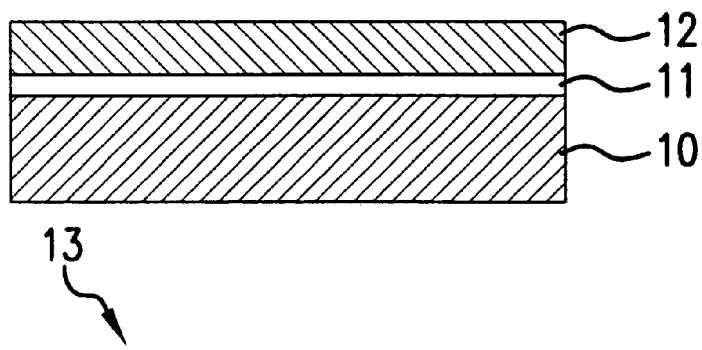
FIGS. 6(a)–6(e) describe a first conventional method of manufacturing a semiconductor structure.
Figure 6B:
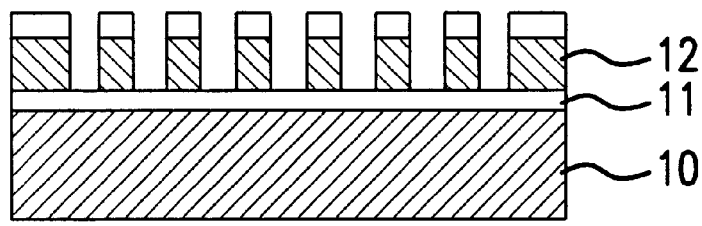
Figure 6C:
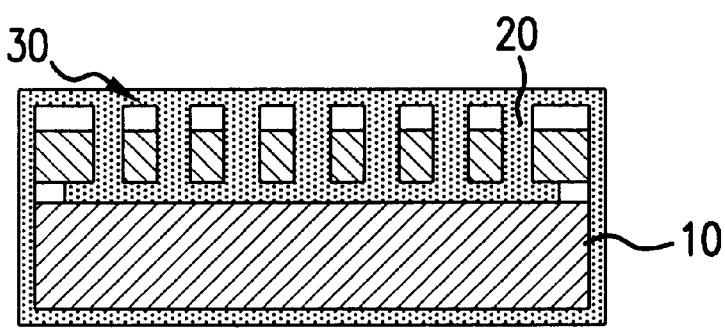
Figure 6D:
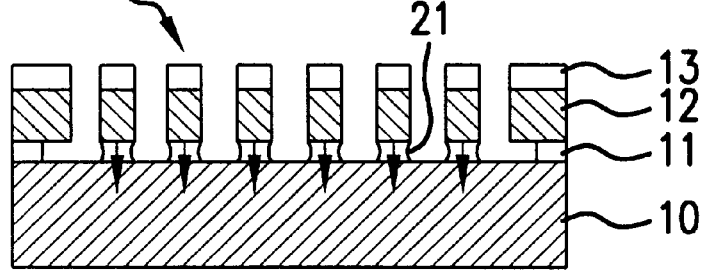
Figure 6E:
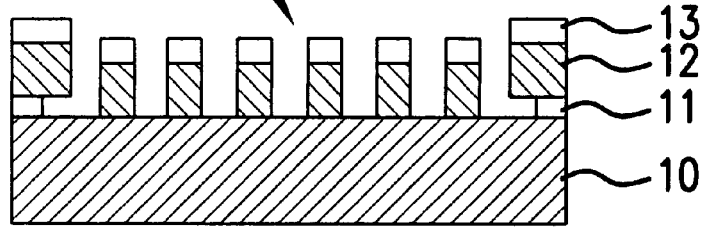
Figure 7A:
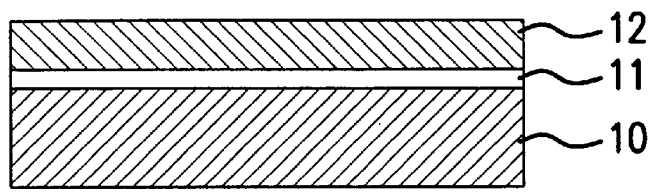
FIGS. 7(a)–7(h) describe a second conventional method of manufacturing a semiconductor structure.
Figure 7B:
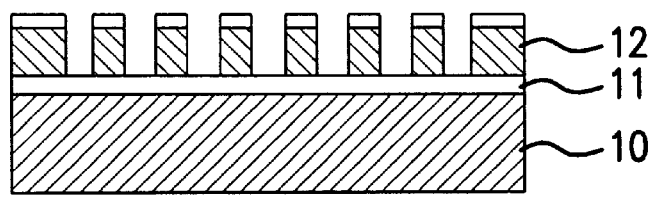
Figure 7C:
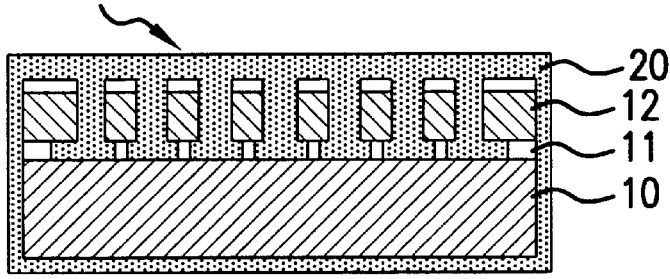
Figure 7D:
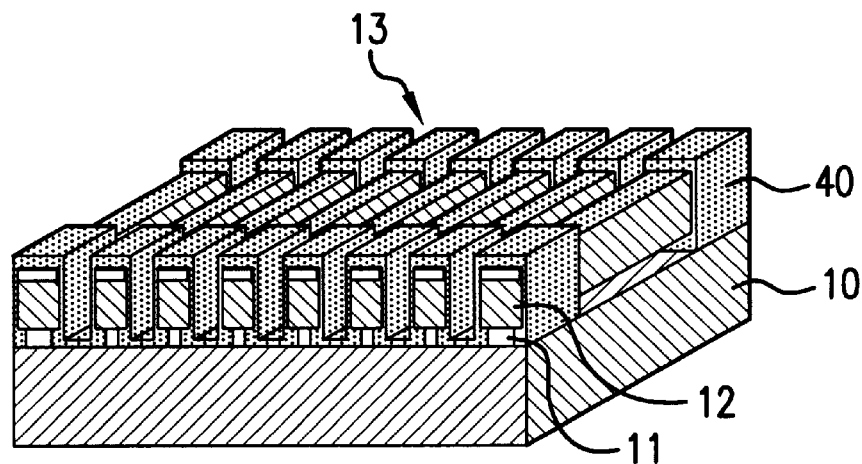
Figure 7E:
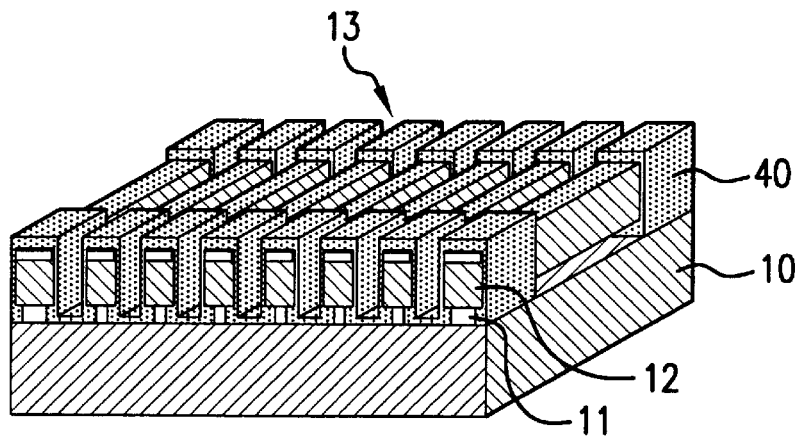
Figure 7F:
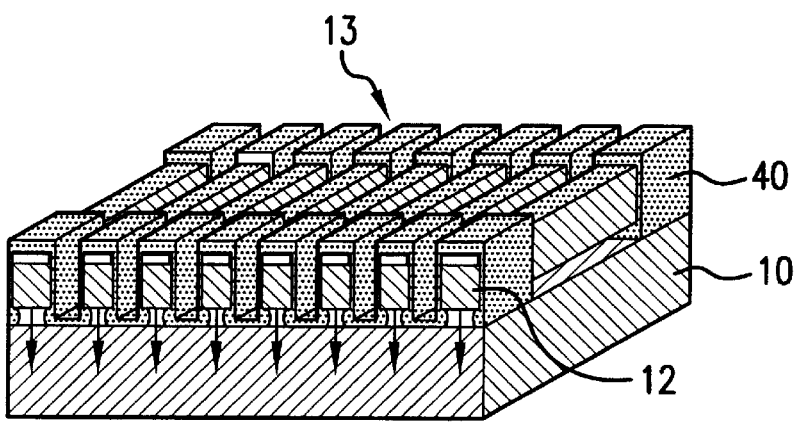
Figure 7G:
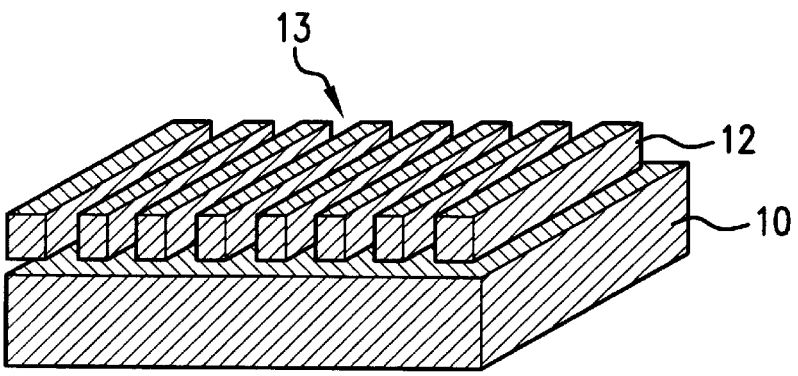
Figure 7H:
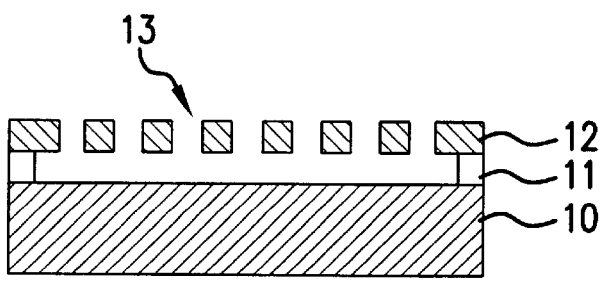
Figure 8A:
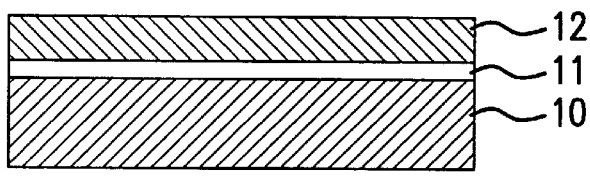
FIGS. 8(a)–8(f) describe a third conventional method of manufacturing a semiconductor structure.
Figure 8B:
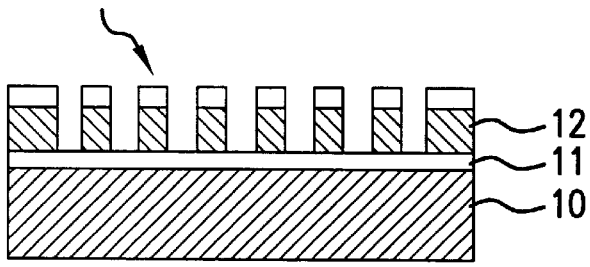
Figure 8C:
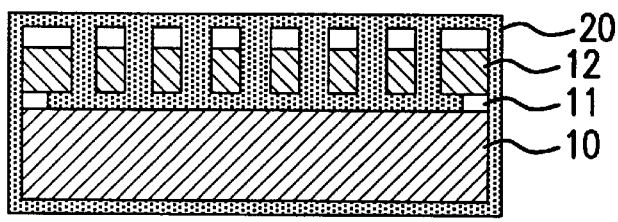
Figure 8D:
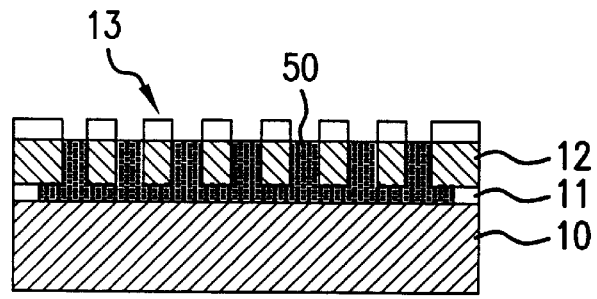
Figure 8E:
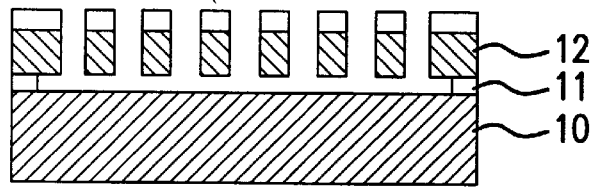
Figure 8F:
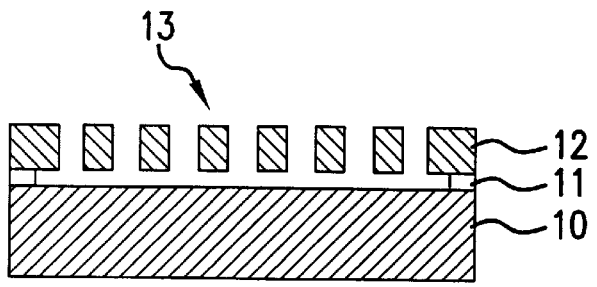

FIG. 4 shows a circuit configured by the semiconductor strain gauges 113a through 113d disposed on the respective beam sections 111a through 111d.

A Wheatstone bridge circuit is formed of the semiconductor strain gauges 113a through 113d. The output voltage of the Wheatstone bridge circuit is amplified by the analog amplifier circuit 105. The sensor characteristics, such as sensitivity and temperature dependence, are adjusted by the digital regulator circuit 104.

When the acceleration sensor, structured as described above, is accelerated in the direction indicated by an arrow Z in the cross sectional view of FIG. 3(b), compressive stresses are caused in the semiconductor strain gauges 113b and 113d, and tensile stresses are caused in the semiconductor strain gauges 113a and 113c. The compressive stresses decrease the resistance values of the respective strain gauges 113b and 113d, and the tensile stresses increase the resistance values of the respective strain gauges 113a and 113c. A sensor output corresponding to the acceleration is obtained from the Wheatstone bridge circuit in response to the resistance variations.

Now a method of manufacturing the acceleration sensor will be described below.

At first, the method of manufacturing the semiconductor structure according to the invention will be outlined.

The method of manufacturing an SOI structure, including a substrate first layer, an insulator second layer on the first layer and an Si active third layer on the second layer, functional devices being wired on the third layer, includes the steps of:

(1) forming general IC devices, such as diffusion wiring, Al wiring, Al pads, and a passivation film, on the third layer, (2) removing the passivation film for forming a sensor structure on the third layer to form etching trenches, (3) patterning a protection resist film, that protects the Al wiring, the Al pads, and the passivation film, in advance to etching the Si third layer and the insulator second layer, (4) shaping the Si third layer with the fundamental shape of the sensor structure, (5) separating portions of the third layer where the etching spacing is longer than the other portions, from the first layer while leaving some portions of the second layer as convexities under the portions of the third layer in removing the second insulator layer with BHF or such an etchant to form a sensor structure, and (6) removing the protection resist film.

Now, the manufacturing process will be described in more detail below with reference to FIGS. 1(a)–1(e).

Figure 1A:
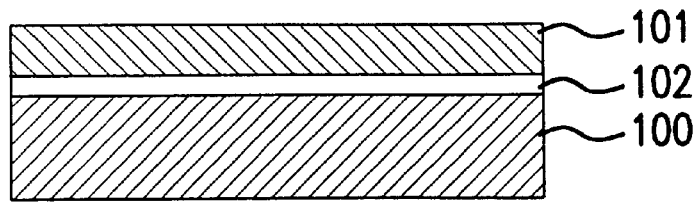
FIGS. 1(a)–1(e) describe a method of manufacturing a semiconductor structure according to a first embodiment of the invention.

Referring now to FIG. 1(a), an SOI wafer including an Si substrate first layer 100, an $SiO_2$ second layer 102 and a thin Si third layer 101, is prepared in the first step.

The semiconductor strain gauges 113a through 113d, the digital regulator circuit 104, the analog amplifier 105, the terminal 106 for input and output, other wiring and indispensable devices are formed in the Si layer 101.

Figure 1B:
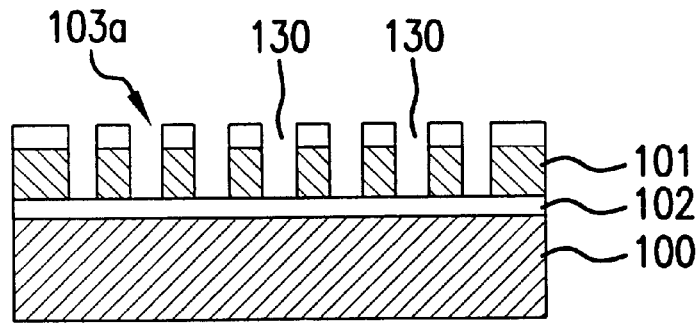

In the step of FIG. 1(b), a resist film is patterned, and a preliminary sensor structure 103a shaped with the fundamental shape of the sensor structure 103 is formed by wet etching using a liquid mixture containing HF and $HNO_3$ or by dry etching using a gas mixture containing $SF_6$ and $O_2$.

By the etching as described above, vertical etching trenches 130 are formed in the preliminary sensor structure 103a. The etching trenches 130 are deep enough to reach the $SiO_2$ second layer 102.

Figure 1C:
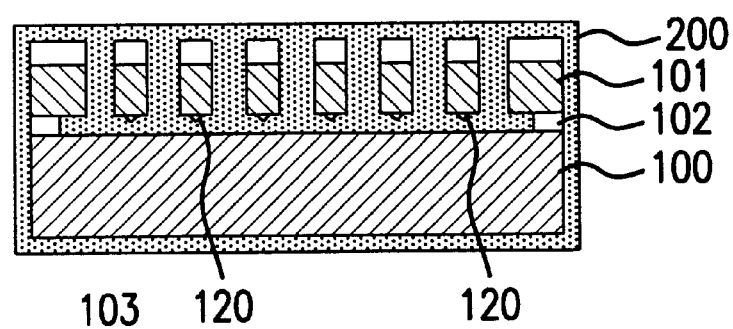
Figure 1D:
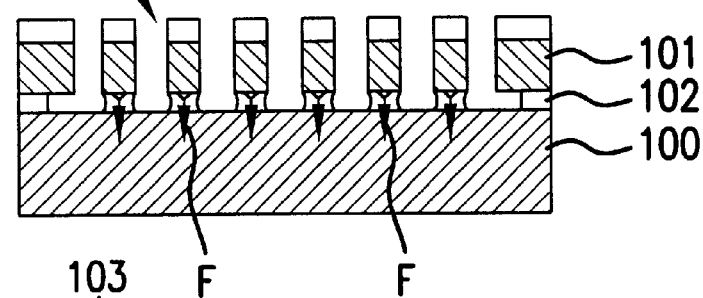
Figure 1E:
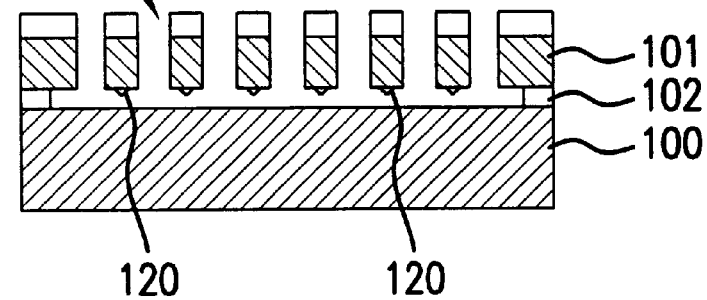

In the step of FIG. 1(c), a sacrificed layer, i.e. portion of the $SiO_2$ second layer 102 remaining under the preliminary sensor structure 103a, is etched and removed with HF or such an etchant 200 through the etching trenches 130.

As the $SiO_2$ second layer 102 is removed, the deformable sensor structure 103 is separated from the Si substrate 100.

The period of time for etching the sacrificed layer is adjusted so that the $SiO_2$ second layer 102 is left to an extent enough to provide the sensor structure 103 with a certain deformable range. Thus, convexities 120 extending toward the Si substrate 100 is formed on the lower surface of the sensor structure 103.

The convexities 120 are the portions of the $SiO_2$ layer 102 intentionally left after the sacrificed layer etching. The area of the tip portions of the convexities is much narrower than the lower surface area of the conventional sensor structure. The tips of the convexities are pointing to the upper surface of the Si substrate 100.

In the step of FIG. 1(*d*), the etchant 200 is replaced and the sensor structure 103 is washed by pure water or with IPA.

The surface tension (attractive force in the direction indicated by an arrow F) of IPA or such a washing liquid caused in the washing step is small, since the area, where the convexities 120 and the Si substrate 100 are facing each other, is narrow. Since the surface tension is small, the sensor structure 103 is dried while it is floating due to the rigidity thereof.

In the step of FIG. 1(*e*), the sensor structure 103 is dried without causing any sticking phenomenon, since the relational expression (weight of the sensor structure 103+spring force of the sensor structure 103)>(surface tension) is held. The sticking phenomenon is prevented without leaving foreign substances in the space left after the sacrificed layer is removed or on the surfaces of the sensor structure 103.

The contact area between the lower surface of the sensor structure and the Si substrate 100 is reduced, and the sticking phenomenon is prevented by leaving some portions of the $SiO_2$ layer 102 as the convexities 120 for reducing the attractive force F, caused by the surface tension, that attracts the sensor structure 103 to the Si substrate 100.

FIGS. 5(*a*)–5(*e*) describe a method of manufacturing a semiconductor structure according to a second embodiment of the invention. In FIGS. 5(*a*)–5(*e*), the same reference numerals as used in FIGS. 1(*a*) through 4 are used to designate the same constituent elements.

In the second embodiment, convexities 120 are formed by etching an $SiO_2$ layer 102 under a sensor structure 103 considering how the sensing objective acts on the sensor structure 103.

In detail, the spacing between the etching portions of the third layer (hereinafter referred to as the "etching spacing of the sensor structure 103" or simply as the "etching spacing") is set to be longer in a portion of the sensor structure 103, where the largest deformation is caused, than that in other portions of the sensor structure 103. Or, the etching spacing is set to be longer in portions of the sensor structure 103, where the deformations are relatively larger, than those in other portions of the sensor structure 103.

Now, the second embodiment of the invention will be described more in detail below.

The second embodiment is described in connection with an acceleration sensor similar to that according to the first embodiment. The method of manufacturing the acceleration sensor according to the second embodiment is described with reference to FIGS. 5(*a*)–5(*e*).

In the step of FIG. 5(*a*), an SOI wafer including an Si substrate first layer 100, an $SiO_2$ second layer 102 and a thin Si third layer 101 is prepared.

Semiconductor strain gauges 113*a* through 113*d*, a digital regulator circuit 104, an analog amplifier 105, terminals 106 for input and output, other wiring and indispensable devices are formed in the Si layer 101.

In the step of FIG. 5(*b*), a resist film is patterned, and a preliminary sensor structure 103*a*, shaped with the fundamental shape of a sensor structure 103, is formed by wet etching using a liquid mixture containing HF and $HNO_3$ or by dry etching using a gas mixture containing $SF_6$ and $O_2$.

By the etching described above, vertical etching trenches 130 are formed through the preliminary sensor structure 103*a*. The etching trenches 130 are deep enough to reach the $SiO_2$ second layer 102.

In the portions of the sensor structure 103, which are not lowed in sensitivity and are deformed more largely than other portions of the sensor structure 103 upon generation of acceleration, the spacing between etching trenches 130 (inclusive of through holes and trenches for etching) is set to be longer by from 1 to 2 $\mu$m than that in the other portions of the sensor structure 103.

The spacing $X_1$ between the etching trenches 130 in the central portion of the sensor structure 103 is longer than the spacing $X_2$ between the etching trenches 130 in the peripheral portion of the sensor structure 103, i.e. $X_1 > X_2$.

In the step of FIG. 5(*c*), the sacrificed layer, i.e. the portion of the $SiO_2$ second layer 102 remaining under the preliminary sensor structure 103*a*, is etched and removed with HF or such an etchant 200 through the etching trenches 130. As the $SiO_2$ second layer 102 is removed, the deformable sensor structure 103 is separated from the Si substrate 100.

The period of time for etching the sacrificed layer is adjusted so that the $SiO_2$ second layer 102 is left to an extent enough to provide the sensor structure 103 with a certain deformable range and so that convexities 120 extending toward the Si substrate 100 are formed on the lower surface of the sensor structure 103. The convexities 120 are portions of the $SiO_2$ layer 102 intentionally left after the sacrificed layer etching. The area of the tip portion of the convexity is much narrower than the lower surface area of the conventional sensor structure. The tips of the convexities are pointing to the upper surface of the Si substrate 100.

Since the period of time for etching the sacrificed layer is constant irrespective of the portions of the sensor structure 103, the narrower $SiO_2$ layer 102 in the region, where the trench spacing is $X_2$, is etched more quickly than the $SiO_2$ layer 102 in the region, where the trench spacing is $X_1$. As a result, the convexities 120 are formed on the lower surface of the sensor structure 103 in the central portion thereof. By adjusting the etching period such that no $SiO_2$ layer 102 is remaining anymore in the region where the trench spacing is $X_2$, the convexities 120 are left only in the central portion of the sensor structure 103.

In the step of FIG. 5(*d*), the etchant 200 is replaced and the sensor structure 103 is washed by pure water or with IPA.

The surface tension 300 (attractive force in the direction indicated by arrows) of IPA or such a washing liquid caused in the washing step is small, since the area, where the convexities 120 and the Si substrate 100 are facing each other, is narrow. Since the caused surface tension 300 is small, the sensor structure 103 is dried while it is floating due to the rigidity thereof.

In the step of FIG. 5(*e*), the sensor structure 103 is dried without causing any sticking phenomenon, since the relational expression (weight of the sensor structure 103+spring force of the sensor structure 103)>(surface tension 300) is held.

In manufacturing a semiconductor device including a deformable sensor structure spaced apart from a substrate according to the invention, convexities with narrower tip areas are formed on the lower surface of the sensor structure. The convexities facilitate, in obtaining a deformable sensor structure, reducing the contact area between the sensor structure and the substrate, reducing the attractive force caused by the surface tension of the etchant or the washing liquid for attracting the sensor structure to the substrate, and preventing the sticking phenomenon.

Since the sticking phenomenon, that is the most serious problem in etching the sacrificed layer, is surely prevented, a reliable semiconductor dynamic quantity sensor is manufactured with high throughput and with low manufacturing costs.

By setting the spacing between the trenches for etching to be wider in the portion of the sensor structure where the largest deformation is caused, or in the portions where relatively large deformations are caused, than that in the other portions of the sensor structure, the sticking phenomenon is prevented effectively in the region where the sticking phenomena might otherwise be caused, and the workability for manufacturing the semiconductor dynamic quantity sensor is improved.

While the invention is explained with reference to the specific embodiments of the invention, the explanation is illustrative and the invention is limited only by the appended claims.

What is claimed is:

1. A semiconductor structure comprising:
   a substrate;
   a deformable beam structure situated above the substrate and having a movable portion with a space relative to the substrate; and
   convexities formed on a lower surface of the movable portion and having tips pointing to the substrate, said tips of the convexities being spaced from the substrate to thereby provide the deformable beam structure with a deformable range.

2. A semiconductor structure according to claim 1, wherein said movable portion of the deformable beam structure has large and largest deformation areas, said convexities being formed at the large and largest deformation areas.

3. A semiconductor structure according to claim 2, wherein said convexities are formed only at the largest deformation areas.

4. A semiconductor structure according to claim 1, wherein said semiconductor structure is formed of a ternary laminate including a first silicon layer as the substrate, a second insulation layer disposed on the first layer, and a third silicon layer disposed on the second layer, said third silicon layer forming the deformable beam structure.

5. A semiconductor structure according to claim 4, further comprising device elements with sensor elements formed on the third layer for detecting displacements.

6. A semiconductor structure according to claim 5, wherein said third silicon layer includes weight sections having a plurality of through holes formed in the third layer, and beam sections sustaining the weight sections and having the sensor elements thereon, said convexities being formed on lower surfaces of the weight sections with the tips thereof pointing to the first layer.

7. A method of manufacturing a semiconductor structure, comprising:
   preparing a laminate formed of a substrate, an insulation layer on the substrate, and an active layer on the insulation layer;
   disposing and wiring functional devices on the active layer;
   forming etching trenches in the active layer to penetrate to the insulation layer; and
   etching the insulation layer with an etchant injected into the etching trenches to thereby form a deformable beam structure with a movable portion above the substrate, an etching time being adjusted to form convexities with tips extending from the deformable beam structure to point to the substrate so that spaces for providing the deformable beam structure with a deformable range are formed between the tips of the convexities and the substrate.

8. A method according to claim 7, wherein said movable portion of the deformable beam structure has large and largest deformation areas, said convexities being formed at the large and largest deformation areas.

9. A method according to claim 8, wherein said convexities are formed only at the largest deformation areas.

10. A method according to claim 7, wherein said substrate is a silicon substrate, and the active layer is a silicon active layer; and said deformable beam structure includes weight sections and beam sections sustaining the weight sections formed by etching, the beam sections including sensor elements for detecting displacements.

* * * * *